(12) United States Patent
Yoo et al.

(10) Patent No.: US 9,695,345 B2
(45) Date of Patent: Jul. 4, 2017

(54) DICING DIE BONDING FILM HAVING EXCELLENT BURR PROPERTY AND RELIABILITY AND SEMICONDUCTOR DEVICE USING THE SAME

(75) Inventors: Hyun Jee Yoo, Daejeon (KR); Jang Soon Kim, Daejeon (KR); Jong Wan Hong, Daejeon (KR); Hyo Soon Park, Daejeon (KR); Dong Han Kho, Daegu (KR)

(73) Assignee: LG Chem, Ltd., Seoul (KR)

( * ) Notice: Subject to any disclaimer, the term of this patent is extended or adjusted under 35 U.S.C. 154(b) by 517 days.

(21) Appl. No.: 12/741,011

(22) PCT Filed: Oct. 28, 2008

(86) PCT No.: PCT/KR2008/006348
§ 371 (c)(1),
(2), (4) Date: Oct. 29, 2010

(87) PCT Pub. No.: WO2009/084804
PCT Pub. Date: Jul. 9, 2009

(65) Prior Publication Data
US 2011/0037180 A1  Feb. 17, 2011

(30) Foreign Application Priority Data
Dec. 27, 2007 (KR) .................. 10-2007-0139051

(51) Int. Cl.
*C09J 163/00* (2006.01)
*C09J 133/08* (2006.01)
(Continued)

(52) U.S. Cl.
CPC .......... *C09J 163/00* (2013.01); *C08G 59/621* (2013.01); *C08K 3/36* (2013.01); *C08K 5/0025* (2013.01);
(Continued)

(58) Field of Classification Search
None
See application file for complete search history.

(56) References Cited

U.S. PATENT DOCUMENTS

| 2006/0154066 A1* | 7/2006 | Kita et al. ................ 428/401 |
| 2007/0218586 A1* | 9/2007 | Yoshimura et al. ......... 438/106 |
| 2007/0276079 A1* | 11/2007 | Saiki et al. ................ 524/493 |

FOREIGN PATENT DOCUMENTS

| JP | 07045557 A | * | 2/1995 |
| JP | 2002-158276 A | | 5/2002 |

(Continued)

OTHER PUBLICATIONS

Machine translation of JP 07075557 A (1995).*

*Primary Examiner* — Frank D Ducheneaux
(74) *Attorney, Agent, or Firm* — Dentons US LLP (57) ABSTRACT

The present invention relates to a dicing die bonding film employed in a semiconductor packaging process, and a semiconductor device using the same. The dicing die bonding film is configured such that a ratio X/Y of adhesive power X between the wafer and the adhesive layer of the die bonding portion to tacky power Y between the die bonding portion and the tacky layer of the dicing portion is 0.15 to 1, and the adhesive layer of the die bonding portion has a storage modulus of 100 to 1000 MPa at a normal temperature. The dicing die bonding film according to the present invention reduces burr generation in dicing process, and thereby preparing a semiconductor device having excellent reliability without inferiority caused by bad connection reliability due to the burr covering a bonding pad.

11 Claims, 3 Drawing Sheets

(51) Int. Cl.

| | | |
|---|---|---|
| *C09J 7/02* | (2006.01) | |
| *C08K 5/13* | (2006.01) | |
| *C08K 5/3442* | (2006.01) | |
| *C08K 3/36* | (2006.01) | |
| *C09J 133/06* | (2006.01) | |
| *C08K 5/3445* | (2006.01) | |
| *C08K 5/00* | (2006.01) | |
| *C08G 59/62* | (2006.01) | |
| *H01L 21/683* | (2006.01) | |
| *H01L 23/00* | (2006.01) | |

(52) U.S. Cl.
CPC .............. *C08K 5/13* (2013.01); *C08K 5/3445* (2013.01); *C09J 133/068* (2013.01); *H01L 21/6836* (2013.01); *H01L 24/27* (2013.01); *H01L 24/29* (2013.01); *H01L 24/83* (2013.01); *C09J 7/0203* (2013.01); *C09J 7/0217* (2013.01); *C09J 2201/36* (2013.01); *C09J 2201/606* (2013.01); *C09J 2203/326* (2013.01); *C09J 2205/102* (2013.01); *H01L 24/32* (2013.01); *H01L 24/48* (2013.01); *H01L 24/85* (2013.01); *H01L 24/94* (2013.01); *H01L 2221/68327* (2013.01); *H01L 2221/68336* (2013.01); *H01L 2221/68377* (2013.01); *H01L 2221/68381* (2013.01); *H01L 2224/27003* (2013.01); *H01L 2224/27436* (2013.01); *H01L 2224/2919* (2013.01); *H01L 2224/2929* (2013.01); *H01L 2224/29387* (2013.01); *H01L 2224/32225* (2013.01); *H01L 2224/83191* (2013.01); *H01L 2224/83862* (2013.01); *H01L 2224/94* (2013.01); *H01L 2924/00014* (2013.01); *H01L 2924/0615* (2013.01); *H01L 2924/351* (2013.01); *H01L 2924/3511* (2013.01); *Y10T 428/287* (2015.01); *Y10T 428/2891* (2015.01); *Y10T 428/31515* (2015.04)

(56) References Cited

FOREIGN PATENT DOCUMENTS

| | | |
|---|---|---|
| JP | 2002-226796 | 8/2002 |
| JP | 2003-206457 | 7/2003 |
| JP | 2004-83836 A | 3/2004 |
| JP | 2004-134689 | 4/2004 |
| JP | 2004-292478 A | 10/2004 |
| JP | 2004-292821 A | 10/2004 |
| JP | 2005-268434 | 9/2005 |
| JP | 2006-161038 | 6/2006 |
| JP | 2007-035852 | 2/2007 |
| KR | 10-2006-0113372 A | 11/2006 |
| KR | 10-2006-0126364 A | 12/2006 |
| TW | 200613508 | 5/2006 |
| TW | 200705603 | 2/2007 |
| TW | 200728427 | 8/2007 |

* cited by examiner

DICING DIE BONDING FILM HAVING EXCELLENT BURR PROPERTY AND RELIABILITY AND SEMICONDUCTOR DEVICE USING THE SAME

This application claims priority to PCT/KR2008/006348 filed on Oct. 28, 2008, and Korean Application No: 10-2007-0139051, filed Dec. 27, 2007, all of which are hereby incorporated by reference herein in its entirety.

TECHNICAL FIELD

The present invention relates to a dicing die bonding film and a semiconductor device, and more particularly, to a dicing die bonding film having a controlled ratio of an adhesive power of a die bonding film to a tacky power of a dicing film so as to decrease burr generation in a dicing process of a semiconductor packaging process and a semiconductor device using the same.

BACKGROUND ART

As semiconductor chips are minimized and highly integrated, one of more advanced packages is a multi chip package (MCP). The MCP is a technique in which an additional chip is mounted on a chip, so that the MCP makes it possible to allow much more components to be mounted in a package with the same size in comparison to a prior art.

In the MCP method, bonding between a semiconductor chip and a semiconductor substrate is made using a film-shaped adhesive, instead of existing liquid epoxy paste (Japanese Laid-open Patent Publication H3-192178 and H4-234472). A method using a film-shaped adhesive includes a film component adhesion method and a wafer backside adhesion method. In the film component adhesion method, a film-shaped adhesive is cut or punched into a piece suitable for the chip and then adheres to a semiconductor substrate. Thereafter, the chip is picked up from the wafer, a die bonding is performed thereon, and then a semiconductor device is prepared through post-processes such as wire bonding and molding.

On the other hand, in the wafer backside adhesion method, one side of a film-shaped adhesive is attached to a backside of a wafer, and a dicing tape having a tacky layer is additionally attached to the other side of the film-shaped adhesive, which does not adhere to the backside of the wafer, so that the wafer is diced into individual chips. The separated chip is picked up and die-bonded to a semiconductor substrate, and then it is made into a semiconductor device through wire bonding and molding. The wafer backside adhesion method has difficulties in conveyance of a thin wafer, increased process number, adaptability for various chip thicknesses and sizes, film thinning, and reliability of high-functional semiconductor device.

In order to solve the above problems, there have been proposed methods in which a film having adhesive agent and tacky agent in one layer adheres to a backside of a wafer (Japanese Laid-open Patent Publication H2-32181, H8-53655 and H10-8001). Such methods do not require two lamination processes but requires only one lamination process, and also a wafer ring for supporting a wafer is provided, so that there is no problem when the wafer is conveyed. According to the above documents, a dicing die bonding integrated film composed of a substrate and a tacky/adhesive agent made of a specific composition includes a radiation-curing tacky agent and a thermosetting adhesive agent in mixture. This adhesive agent plays a role of a tacky agent in a dicing process, and then loses its tacky power through a radiation-curing process to facilitate picking-up of the chip from the wafer. Also, the adhesive agent is thermoset as an adhesive agent in a die-bonding process, so that the chip is firmly adhered to a semiconductor substrate. However, tacky power of the dicing die bonding integrated film is not sufficiently lowered after radiation curing, so that the chip may not be easily separated from a substrate during a semiconductor chip pick-up process after the dicing, which may cause inferiorities.

In order to solve the problem of the integrated film, there has been proposed a dicing die bonding separation film composed of two layers of tacky layer and adhesive layer such that it may be used as a dicing tape in a dicing process and also used as an adhesive agent in a die bonding process. Since the tacky layer and the adhesive layer are easily separated by heat or radiation curing after the dicing process, the dicing die bonding separation film does not cause any problem during the semiconductor chip pick-up process, and also may conveniently allow thinning a thickness of the film during the die bonding process. Due to the above advantages, film-shaped adhesives are more frequently used in an actual packaging process although they have problems in filling-up when adhering to a semiconductor substrate, in comparison to existing liquid epoxy.

However, such dicing die bonding separation film has a multi-layered structure, so that burr is generated due to severe external conditions occurring in a dicing process due to difference in property between the layers. Thus, in order to apply the dicing die bonding separation film to a semiconductor chip, which is directed to smaller and thinner design, with high reliability, it is urgent to develop a method for ensuring balanced properties between layers in addition to basic properties of the dicing die bonding film and thus minimizing burr.

DISCLOSURE

Technical Problem

The present invention is provided to solve the aforementioned problems in the prior art. An object of the present invention is to provide a dicing die bonding film having improved reliability of a packaging process by ensuring balanced properties between layers of the dicing die bonding film of a multi-layer structure and thus minimizing burr generation in a dicing process, and a semiconductor wafer and a semiconductor device using the same.

Technical Solution

According to an aspect of the present invention for achieving the object, there is provided a dicing die bonding film, which comprises a die bonding portion having an adhesive layer adhering to a wafer; and a dicing portion having a tacky layer, wherein a ratio X/Y of adhesive power X between the wafer and the adhesive layer of the die bonding portion to tacky power Y between the die bonding portion and the tacky layer of the dicing portion is 0.15 to 1, and the adhesive layer of the die bonding portion has a storage modulus of 100 to 1000 MPa at a normal temperature.

According to another aspect of the present invention for achieving the object, there is provided a semiconductor wafer, wherein the adhesive layer of the dicing die bonding film according to the present invention is attached to one side of a wafer, and the tacky layer of the dicing die bonding film is fixed to a wafer ring frame.

According to a further aspect of the present invention for achieving the object, there is provided a semiconductor device, which comprises a wiring substrate; the adhesive layer of the dicing die bonding film according to the present invention attached to a chip mounting surface of the wiring substrate; and a semiconductor chip mounted on the adhesive layer.

Advantageous Effects

A dicing die bonding film of the present invention minimizes burr generation in an adhesive film to less than 2% in a process where it is attached to a backside of a wafer and diced into individual chips, and it is adhered without any inferiority in connection reliability, since a bonding pad is covered by burrs, so that a semiconductor device with excellent reliability may be prepared thereby.

EXPLANATION OF REFERENCE NUMERALS FOR MAJOR PORTIONS SHOWN IN DRAWINGS

Figure 1:
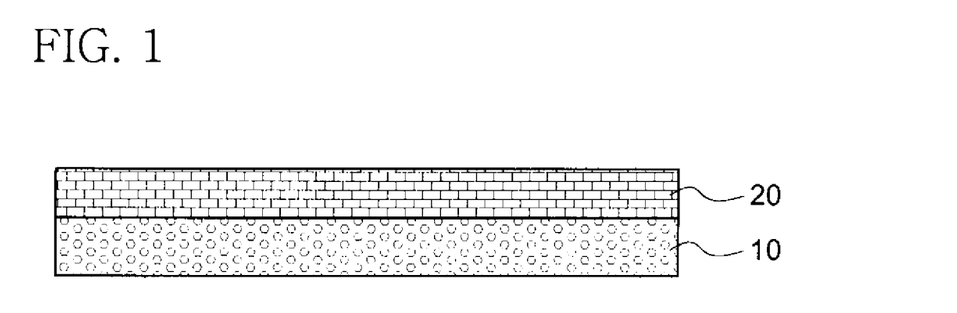
FIG. 1 is a sectional view of a die bonding film according to an embodiment of the present invention.
Figure 2:
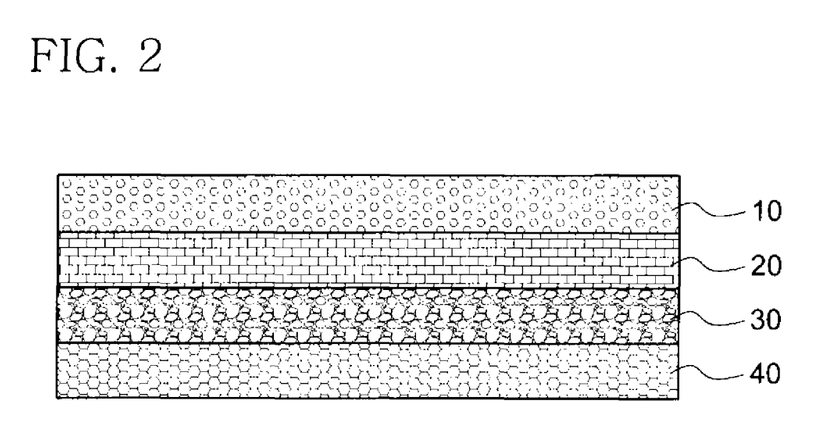
FIG. 2 is a sectional view of a dicing die bonding film according to an embodiment of the present invention.
Figure 3:
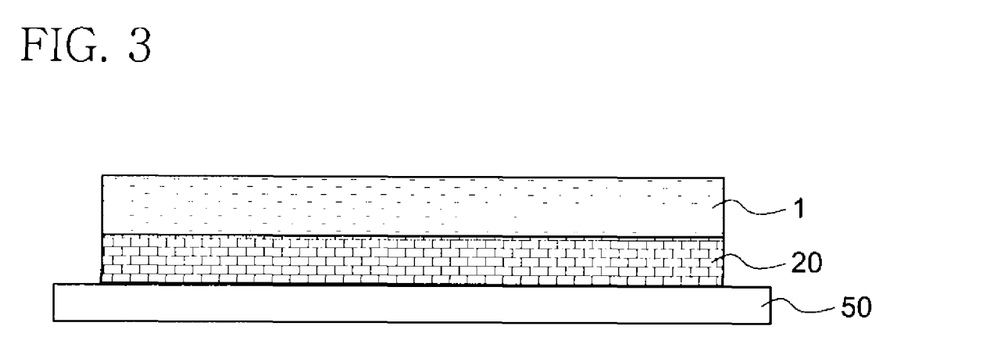
FIG. 3 is a sectional view of a semiconductor device according to an embodiment of the present invention.

1: Semiconductor chip
10: Protective film of die bonding portion
20: Adhesive layer of die bonding portion
30: Tacky layer of dicing portion
40: Substrate film of dicing portion
50: Wiring substrate

BEST MODE

The present invention relates to a dicing die bonding film, which comprises a die bonding portion having an adhesive layer adhering to a wafer; and a dicing portion having a tacky layer, wherein a ratio X/Y of adhesive power X between the wafer and the adhesive layer of the die bonding portion to tacky power Y between the die bonding portion and the tacky layer of the dicing portion is 0.15 to 1, and the adhesive layer of the die bonding portion has a storage modulus of 100 to 1000 MPa at a normal temperature.

Generally, during a dicing process in which a semiconductor wafer formed a pattern is singulated, temperature increases due to friction between a wafer and a rotating blade in which diamond grits are stuck. This heat provides fluidity to a dicing die bonding film attached to a backside of a wafer, which may cause an aggregation of polymer in a cutting line, and burr may be generated due to the rotating blade at an edge of the die during a cross cutting process.

If the ratio X/Y of the adhesive power X between the wafer and the adhesive layer of the die bonding portion to the tacky power Y between the die bonding portion and the tacky layer of the dicing portion is 0.15 to 1, it is possible to reduce the burr generation caused by the above factor. Preferably, the ratio X/Y of the adhesive power X between the wafer and the adhesive layer of the die bonding portion to the tacky power Y between the die bonding portion and the tacky layer of the dicing portion is 0.2 to 0.8, and more preferably 0.25 to 0.5. If the ratio is less than 0.15, a burr generation rate increases. Also, if the chip is singulated into a small size, separation may occur in an interface between the chip and the adhesive layer of the die bonding portion, so that chips may be scattered. Further, if the ratio exceeds 1, pick-up property of the wafer from the dicing tape may be inferior.

In addition, the adhesive layer of the die bonding portion employed in the dicing die bonding film of the present invention has a storage modulus of 100 to 1000 MPa, preferably 100 to 500 MPa, more preferably 100 to 300 MPa, at a normal temperature. If the adhesive layer of the die bonding portion has a storage modulus less than 100 MPa at a normal temperature, although close adhesion of the adhesive layer to the wafer is improved, heat resistance of the film itself is deteriorated, which may give bad effect on high temperature reliability. If the storage modulus exceeds 1000 MPa at a normal temperature, close adhesion to the wafer is deteriorated, which may cause burr generation or chip scattering.

Further, in the dicing die bonding film, the adhesive power X between the wafer and the adhesive layer of the die bonding portion is 20 gf or more. Preferably, the adhesive power X is 25 to 100 gf, more preferably 30 to 75 gf. If the adhesive power X is less than 20 gf, the adhesive power of the adhesive layer of the die bonding portion to the backside of the wafer is deteriorated, so that it may cause chip scattering during the dicing process.

Hereinafter, components of the dicing die bonding film according to the present invention will be described in detail.

Die Bonding Portion Having Adhesive Layer

In the present invention, the adhesive layer of the die bonding portion should satisfy both features of bending and stress relief between a chip and a substrate in a package. The chip has a coefficient of thermal expansion (CTE) of 4 ppm/° C., and the substrate has a CTE of 10 to 15 ppm/° C., so that the difference in CTE may cause bending and tearing in high temperature.

Thus, in order to realize the above properties, the adhesive layer of the present invention uses a) thermosetting multi-functional epoxy resin to reduce CTE, thereby minimizing bending and improving properties such as adhesive power and heat resistance, and b) low elasticity high molecular resin to relieve stress at high and low temperatures. That is, since two kinds of resins having different elasticity each other are mixed and used by applying a polymer alloy technique, soft segment and hard segment coexist, and thereby satisfying both the features.

a) Thermosetting Multi-Functional Epoxy Resin

The a) thermosetting multi-functional epoxy resin used in the present invention may comprise any resin without limitation if it contains at least two epoxy groups in a main chain and has a glass transition temperature of 50° C. or above. For example, an epoxy resin having a repeated unit of aromatic structure in a main chain which is a framework of epoxy may be used. If the glass transition temperature is lower than 50° C., tack of the adhesive layer is increased, which makes it difficult to handle the adhesive layer, and also peeling property from the dicing tape may also be deteriorated.

Such an epoxy resin forms a crosslinked structure by a curing process, so that it is hardened and has excellent adhesive power, heat resistance and mechanical strength such as.

Preferably the thermosetting multi-functional epoxy resin has an average epoxy equivalent weight of 180 to 1000. If the epoxy equivalent weight is less than 180, a crosslinking density is so high that all of the adhesive film may show rigid property. If the epoxy equivalent weight exceeds 1000, the glass transition temperature may be lowered, contrary to the characteristic of the present invention requiring high temperature resistance. For example, the epoxy resin may be cresol novolac epoxy resin, bisphenol A-type novolac epoxy resin, phenol novolac epoxy resin, 4-functional epoxy resin, biphenyl-type epoxy resin, tri-phenol methane-type epoxy resin, alkyl-modified tri-phenol methane epoxy resin, naphthalene-type epoxy resin, dicyclopentadiene-type epoxy resin, or dicyclopentadiene-modified phenol-type epoxy resin, which may be used solely or in mixture of at least two of them.

The thermosetting multi-functional epoxy resin preferably has a softening point of 50 to 100° C. If the softening point is lower than 50° C., modulus of the adhesive film in A-stage state is deteriorated, and tack is increased to deteriorate handling property thereof. If the softening point is higher than 100° C., The property of adhering to the wafer is deteriorated, which may cause chip scattering in dicing process.

The content of the thermosetting multi-functional epoxy resin is preferably 10 to 200 parts by weight, more preferably 20 to 100 parts by weight, based on 100 parts by weight of the b) low elasticity high molecular resin. If the content is less than 10 parts by weight, heat resistance and handling property are deteriorated. If the content exceeds 200 parts by weight, rigidity of the film is increased, thereby deteriorating workability and reliability.

b) Low Elasticity High Molecular Resin

The b) low elasticity high molecular resin used in the present invention has a glass transition temperature of 50° C. or below, keeps a film shape with high molecular weight without breakdown before curing, forms a crosslinked structure with the a) thermosetting multi-functional epoxy resin or a c) curing agent to be described later, and still has viscoelasticity after becoming a crosslinked material. All of the resins having the above features may be used without limitation. Also, in a varnish state before forming a film shape, it should be compatible with the a) thermosetting multi-functional epoxy resin and the c) curing agent, and have storage stability, for example, without experiencing phase separation.

Before being cured, the low elasticity high molecular resin preferably has a glass transition temperature of −30 to 50° C., more preferably −20 to 40° C., most preferably 0 to 30° C.

If the glass transition temperature is lower than −30° C., fluidity is increased during the film forming process, so that a handling property is deteriorated. If the glass transition temperature exceeds 50° C., The property of adhering to the wafer is deteriorated, which causes scattering of chips during the dicing process or penetration of washing water into spaces between adhesive and chips.

The low elasticity high molecular resin preferably has an average molecular weight of 100,000 to 2,500,000, more preferably 100,000 to 800,000. If the average molecular weight is less than 100,000, strength of the film is deteriorated, thereby lowering handling property and heat resistance and making it impossible to control fluidity during circuit filling of the semiconductor substrate. If the average molecular weight exceeds 2,500,000, the modulus of elasticity is increased, and fluidity is suppressed too seriously during the die bonding process, thereby decreasing reliability and circuit filling of the adhesive film.

The low elasticity high molecular resin having a glass transition temperature of −30 to 50° C. and an average molecular weight of 100,000 to 2,500,000 preferably has a structure with excellent self elasticity, and for example, it may be nitrile butadiene rubber (NBR) containing carboxyl group; aliphatic epoxy having high molecular weight; rubber-modified epoxy; acryl copolymer containing glycidyl group, carboxyl group, hydroxyl group or amine group; maleic acid-modified styrene ethylene butadiene styrene copolymer (SEBS); or the like, which may be used solely or in mixture of at least two of them.

c) Curing Agent

The adhesive layer of the die bonding portion may further include a curing agent. The c) curing agent used in the present invention may include any resin without limitation if it may form a crosslinked structure by reacting with the a) thermosetting multi-functional epoxy resin and/or the b) low elasticity high molecular resin. However, considering the aspect that the curing agent makes a crosslinked structure respectively with the b) low elasticity high molecular resin forming a soft segment and the a) thermosetting multi-functional epoxy resin forming a hard segment to improve heat resistance of the adhesive cured material, and at the same time, functions as linkage between both resins at an interface between the a) thermosetting multi-functional epoxy resin and the b) low elasticity high molecular resin to greatly improve reliability of the semiconductor package, the curing agent preferably comprises a resin that reacts with both of the a) thermosetting multi-functional epoxy resin and the b) low elasticity high molecular resin to form a crosslinked structure.

As for such resins, a multi-functional phenol resin is preferred in terms of heat resistance, and the phenol resin preferably has a hydroxyl equivalent weight of 100 to 1000. In a case where the hydroxyl equivalent weight is less than 100, although being different depending on its kind, a cured material reacting with epoxy is generally hardened, thereby deteriorating a relieving effect of the adhesive film in the semiconductor package. If the hydroxyl equivalent weight exceeds 1000, a crosslinking density of the cured material reacting with epoxy is deteriorated, which may degrade heat resistance.

The multi-functional phenol resin may include bisphenol A resin, phenol novolac resin, cresol novolac resin, bisphenol A novolac resin, phenol aralkyl resin, multi-functional novolac, dicyclopentadiene phenol novolac resin, amino triazine phenol novolac resin, polybutadiene phenol novolac resin, biphenyl-type resin, or other kinds of multi-functional resins, which may be used solely or in mixture of at least two of them.

In addition, the curing agent preferably has a softening point of 50 to 150° C. If the softening point is lower than 50° C., tack property is increased to deteriorate handling property and to cause poor heat resistance. If the softening point is higher than 150° C., hardness of the adhesive film is increased to deteriorate adhesive power between the adhesive film and the wafer, which may cause inferiorities such as chip scattering in dicing process.

The curing agent has equivalent weight preferably 0.4 to 2 times, more preferably 0.8 to 1.2 times as large as the epoxy equivalent weight of the a) thermosetting multi-functional epoxy resin. If the equivalent weight of the curing agent is less than 0.4 times as large as the epoxy equivalent weight of the a) thermosetting multi-functional epoxy resin, a large amount of non-reacted epoxy remains to thereby lower the glass transition temperature and deteriorate heat resistance, and heat should be supplied at high temperature or for a long time to reaction of the non-reacted epoxy groups. If the equivalent weight of the curing agent is large than 2 times as large as the epoxy equivalent weight thereof, although a crosslinking density is increased, non-reacted hydroxyl groups may deteriorate storage stability and increase moisture absorption rate and dielectric characteristic.

d) Curing Promoting Agent

The adhesive layer of the die bonding layer may further include a curing promoting agent. The curing promoting agent used in the present invention is not specially limited in its kind, and may include imidazoles, triphenylphosphine (TPP), tertiary amine, and the like. Imidazole curing promoting agent may be 2-methyl imidazole (2MZ), 2-ethyl-4-methyl imidazole (2E4MZ), 2-phenyl imidazole (2PZ), 1-cyanoethyl-2-phenyl imidazole (2PZ-CN), 2-undecyl imidazole (C11Z), 2-heptadecyl imidazole (C17Z), or 1-cyanoethyl-2-phenyl imidazole trimethalate (2PZ-CNS), which may be used solely or in mixture of at least two of them.

The curing promoting agent preferably has the content of 0.1 to 10 parts by weight, more preferably 0.5 to 3, based on 100 parts by weight of the sum of the a) thermosetting multi-functional epoxy resin and the b) low elasticity high molecular resin. If the content of the curing promoting agent is less than 0.1 parts by weight, reaction rate is deteriorated, which results in insufficient crosslink of the epoxy resin thereby deteriorating heat resistance. If the content exceeds 10 parts by weight, curing reaction occurs abruptly, thereby deteriorating storage stability.

e) Inorganic Filler

The adhesive layer of the die bonding portion may further include an inorganic filler. The addition of the inorganic filler allows improved handling property, improved heat resistance, and control of melt viscosity. The filler may include organic filler and inorganic filler, wherein inorganic filler is preferred in terms of property. The inorganic filler is not specially limited, but preferably is silica, aluminum hydroxide, calcium carbonate, magnesium hydroxide, aluminum oxide, talc, aluminum nitride, or the like.

The content of the filler is not specially limited, but preferably 0.5 to 100 parts by weight, more preferably 5 to 50 parts by weight, based on 100 parts by weight of the resin except for the filler. If the content is less than 0.5 parts by weight, the addition of the filler does not give sufficient improvement in heat resistance and handling property. If the content exceeds 100 parts by weight, workability and substrate adhension property are deteriorated.

An average diameter of the filler is preferably 0.001 to 10 μm, more preferably 0.005 to 1 μm. If the average diameter is less than 0.001 μm, the filler may be easily condensed in the adhesive film and causes bad appearance. Also, if the average diameter exceeds 10 μm, the filler may easily protrude from the surface of the adhesive film, damage chips at thermal compression with a wafer, and deteriorate effect of adhesion.

Protective Film

The die bonding portion of the dicing die bonding film according to the present invention preferably includes a protective film on one side of the adhesive layer. Also, the protective film is preferably treated to be releasable.

The protective film usable in the present invention may include a plastic film such as a polyethylene terephthalate film, a polytetrafluoroethylene film, a polyethylene film, a polypropylene film, a polybutene film, a polybutadiene film, a vinyl chloride copolymer film, a polyimide film, and the like.

Also, a releasing agent for releasing treatment on the surface of the protective film may be alkyd-based, silicon-based, fluorine-based, unsaturated ester-based, polyolefin-based, or wax-based resins, among which the alkyd-based, silicon-based or fluorine-based resin is preferred due to heat resistance thereof.

The protective film generally has a thickness of 10 to 500 μm, preferably 20 to 200 μm. If the thickness is less than 10 μm, the film may be easily deformed during a drying process, resulting in irregular appearance of the adhesive layer. The thickness exceeding 500 μm is not economical.

Method for Preparing Die Bonding Portion

The die bonding portion of the dicing die bonding film according to the present invention may be prepared by the steps of: dissolving or dispersing the above adhesive layer composition in a solvent to prepare a resin varnish; applying the resin varnish to a releasing-treated protective film; and heating the protective film to remove the solvent.

The composition of the adhesive layer is already mentioned above, and the varnish-making solvent for preparing the adhesive layer composition may generally be methyl ethyl ketone (MEK), acetone, toluene, dimethylformamide (DMF), methylcellosolve (MCS), tetrahydrofuran (THF), or N-methylpyrrolidone (NMP). Since the protective film has not good heat resistance, so that a solvent with a low boiling point is preferably used. However, a solvent with a high boiling point may also be used to improve uniformity of film, and at least two kinds of such solvents may also be used in mixture.

The resin varnish may be applied to the protective film by a conventional method. For example, knife coating, roll coating, spray coating, gravure coating, curtain coating, comma coating or leaf coating methods may be used.

In a case where filler is included in the adhesive layer composition, in order to enhance dispersion in the adhesive layer, it is possible to use ball mill, bead mill, three rolls, or pulverizer solely or in combination. Balls or beads may be made of glass, alumina or zirconium, wherein balls or beads made of zirconium are preferred in terms of dispersion of particles.

In the present invention, the solvent and the filler are mixed for a certain time in ball mill or bead mill, and then the a) thermosetting multi-functional epoxy resin and the c) curing agent are added thereto and then mixed, and finally the c) low elasticity high molecular resin and additives required if necessary are mixed, which makes it easy to shorten a mixing time and ensures good dispersion.

In addition, when the protective film is heated to remove the solvent, the heating condition is preferably at 70 to 250° C. for 1 to 10 minutes.

Dicing Portion Having Tacky Layer

The tacky layer of the dicing portion of the present invention may include any tacky agent without limit if it may fix a wafer ring and a wafer in dicing process to prevent chips scattering during a singulation process and then lose its tacky power by heat and/or radiation to ensure good pick-up process. In general, an acryl-based copolymer is preferably used as the tacky agent.

The acryl-based copolymer used as a thermosetting tacky agent in the present invention is not specially limited but may preferably include all of tacky agents usable in the art. For example, the acryl-based copolymer is preferably obtained by copolymerizing a (meta)acrylic acid ester-based monomer having an alkyl group of 1 to 12 carbons and a crosslinking functional group-containing monomer.

The (meta)acrylic acid ester-based monomer having an alkyl group of 1 to 12 carbons may include methyl(meta)acrylate, ethyl(meta)acrylate, n-propyl(meta)acrylate, iso-propyl(meta)acrylate, butyl(meta)acrylate, t-butyl(meta)acrylate, pentyl(meta)acrylate, 2-ethylhexyl(meta)acrylate, n-octyl(meta)acrylate, n-tetradecyl(meta)acrylate, and the like, which may be used solely or in mixture of at least two of them.

In addition, the crosslinking functional group-containing monomer may include, for example, a hydroxy group-containing monomer, such as 2-hydroxyethyl(meta)acrylate, 2-hydroxylpropyl(meta)acrylate, 4-hydroxybutyl(meta)acrylate, 6-hydroxyhexyl(meta)acrylate, 2-hydroxyethyleneglycol(meta)acrylate, or 2-hydroxypropyleneglycol(meta)acrylate; a carboxyl group-containing monomer, such as (meta)acrylic acid, maleic acid, or fumaric acid; a nitrogen-containing monomer, such as acryl amide, N-vinyl pyrrolidone, or N-vinyl caprolactam; and the like, which may be used solely or in mixture of at least two of them.

The weight ratio of the alkyl(meta)acrylic acid ester-based monomer and the crosslinking functional group-containing monomer is not limited, but the crosslinking functional group-containing monomer is preferably 1 to 20 parts by weight of the based on 100 parts by weight of the (meta)acrylic acid ester-based monomer.

In order to give tacky power and condensing power to the acryl-based copolymer, the alkyl(meta)acrylic acid ester-based monomer may be copolymerized with a co-monomer having a high glass transition temperature. The copolymerizable co-monomer may include methyl acrylate, methyl methacrylate, ethyl methacrylate, vinyl acetate, styrene, acrylonitrile, and the like, which may be used solely or in mixture of at least two of them. Any monomer having a copolymerizable vinyl group is also preferred.

In the present invention, polymerization of the acryl-based copolymer is not specially limited but may be performed by various polymerization methods, such as solution polymerization, photopolymerization, bulk polymerization, suspension polymerization, and emulsion polymerization methods, among which solution polymerization is preferred.

In addition, the tacky layer may further include a multi-functional crosslinking agent so as to control a tacky characteristic of the tacky agent. The multi-functional crosslinking agent serves to enhance condensing power of the tacky agent and control tacky power by reacting with carboxyl group and hydroxyl group. The content of the multi-functional crosslinking agent is preferably 0.01 to 10 parts by weight based on 100 parts by weight of the acryl-based copolymer.

The multi-functional crosslinking agent may include isocyanate-based, epoxy-based, aziridine-based, metal chelate-based crosslinking agents, and the like, among which isocyanate-based crosslinking agent is preferred. The isocyanate-based crosslinking agent may include tolylenediisocyanate, xylenediisocyanate, diphenylmethanediisocyanate, hexamethylenediisocyanate, isoform diisocyanate, tetramethylxylene diisocyanate, naphthalenediisocyanate, and their reactants with polyol such as trimethylolpropane.

In addition, the epoxy-based crosslinking agent may be ethyleneglycoldiglycidylether, triglycidylether, trimethylolpropanetriglycidylether, N,N,N,N'-tetraglycidylethylenediamine, glycerin diglycidylether, or the like. The aziridine-based crosslinking agent may be N,N'-toluene-2,4-bis(1-aziridinecarboxide), N,N'-diphenylmethane-4,4'-bis(1-aziridinecarboxyde), triethylenemelamine, bisisoprothaloyl-1-(2-methylaziridine), tri-1-aziridinylphosphineoxide, or the like.

The metal chelate-based crosslinking agent may include a compound, in which multivalent metal such as aluminum, iron, tin, zinc, titan, antimony, magnesium, and vanadium is coordinated to acetylacetone or ethyl acetoacetate.

The tacky layer of the present invention may be prepared without using any method specially limited, and obtained by mixing the acryl-based copolymer and the multi-functional crosslinking agent by a common method. Here, the multi-functional crosslinking agent may perform a uniform coating process only when functional group crosslinking reaction does not substantially occur during the mixing process for forming a tacky layer. If the coating process is completed and then drying and aging processes are conducted, a crosslinked structure is formed, which prepares a tacky layer with elasticity and strong condensing power. At this time, the strong tacky power of the tacky agent improves tacky property and cutting property, such as durability reliability of tacky products.

In the present invention, acryl-based low molecular material, resing provided tackiness, epoxy resin, curing agent and the like may be additionally mixed for a special purpose, and UV stabilizer, anti-oxidizer, colorant, reinforcing agent, filler, antifoaming agent, surfactant, plasticizer, foaming agent, and the like may be suitably added depending on general purposes.

A radiation-curing tacky agent may be rubber-decompression tacky agent, acryl-based tacky agent, or the like. The radiation-curing tacky agent may be prepared by adding a radiation-curing composition to the thermosetting tacky agent. This composition may be addition polymerization compound with at least two unsaturated bonds, photopolymerization compound, or photopolymerization initiator.

The addition polymerization compound having at least two unsaturated bonds may be multivalent alcohol-based ester of acrylic acid or methacrylic acid, oligo ester, epoxy-based, urethane-based compound, or the like.

The photopolymerization compound having an epoxy group, such as an alkoxy silane, is added to the thermosetting tacky composition, and then mixed, coated and thermoset.

Thereafter, it is used in a non-cured state. The content of the photopolymerization compound is preferably 3 to 500 parts by weight based on 100 parts by weight of the thermosetting tacky resin.

The photopolymerization initiator is used for curing the photopolymerization compound, and may be carbonyl compound, organic sulfur compound, peroxide, amine or onium salt-based compound, as a specific example. The content of the photopolymerization initiator is preferably 0.1 to 20 parts by weight based on 100 parts by weight of the photopolymerization compound.

In addition, the radiation-curing tacky agent may comprise an acryl-based polymer having a radical-reactive unsaturated group or having an epoxy group in molecule on the side chain, or an epoxy group functional crosslinking agent having one or more epoxy groups in molecule such as ethylene glycol diglycidyl ether may further be added to enhance a crosslinking efficiency.

The dicing portion of the dicing die bonding film according to the present invention preferably further includes a substrate film on the tacky layer.

The substrate film used in the present invention, for example, may be a film made of polypropylene, polyethylene, polyester, polycarbonate, ethylene-vinyl acetate copolymer, ethylene-propylene copolymer, ethylene-ethylacrylate copolymer, polyvinyl chloride, or a mixture of two or more of them, and include the other polymer film, metal foil and the like. The substrate film suitably has a thickness of 10 to 200 μm, preferably 50 to 180 μm, more preferably 80 to 150 μm. If the thickness of the substrate film is less than 10 μm, it is very unstable to control a cut depth in dicing process. If the thickness exceeds 200 μm, the substrate film is so thick to rather increase the possibility of burr in dicing process, and also has low elongation, which makes it difficult to precisely execute an expending process.

In the present invention, a method for making a dicing tape by forming a tacky layer on a substrate film is not specially limited, but may include a method for applying a tacky agent directly to a surface of a substrate film using a bar coater and then drying it, and a method for applying a tacky agent to a releasable substrate surface, drying it, transferring the tacky layer formed on the releasable substrate surface to a surface of a substrate film and then aging it. The tacky layer preferably has a thickness of 1 to 100 μm, more preferably 5 to 30 μm. If the tacky layer has a thickness smaller than the above thickness range, it is difficult to obtain a uniform tacky layer, thereby obtaining nonuniform properties of the tacky film.

The method for preparing a dicing die bonding film according to the present invention may include a method for laminating the dicing tape and the die bonding portion using a hot roll and a press, wherein the hot roll laminating method is preferred in terms of possibility of continuous processes and efficiency. The hot roll laminating method is preferably performed at 10 to 100° C. with a pressure of 0.1 to 10 kgf/cm$^2$.

The present invention also relates to a semiconductor wafer, wherein the adhesive layer of the dicing die bonding film according to the present invention is attached to one side of a wafer, and the tacky layer of the dicing die bonding film is fixed to a wafer ring frame.

The above semiconductor wafer may be prepared by attaching the adhesive layer of the dicing die bonding film to a backside of the wafer at 0 to 180° C. and fixing the tacky layer of the dicing die bonding film to the wafer ring frame.

In addition, the present invention also relates to a semiconductor device, which comprises a wiring substrate; the adhesive layer of a dicing die bonding film according to the present invention, which is attached to a chip mounting surface of the wiring substrate; and a semiconductor chip mounted on the adhesive layer.

A process of preparing the semiconductor device will be described as follows.

The semiconductor wafer to which the aforementioned dicing die bonding film is attached is completely cut using a dicing apparatus and thus divided into individual chips.

Thereafter, if the dicing tape is a radiation-curing tacky agent, the tacky layer is irradiated from the substrate side to be cured. However, if the dicing tape is a thermosetting tacky agent, the tacky agent is heated to be cured. The tacky layer cured by radiation or heat exhibits lowered adhesive power with the adhesive layer, so that chips may be more easily picked up in the following process. Here, if necessary, the dicing die bonding film may be expanded. If such expanding process is performed, a gap between the chips is defined, so that the chip is more easily picked up. In addition, the adhesive layer and the tacky layer cross each other, so that the pick-up process becomes more efficient.

The pick-up process is continued. Here, the semiconductor wafer and the adhesive layer of the dicing die bonding film are separated from the tacky layer of the dicing die bonding film, thereby obtaining the chip to which only the adhesive layer is attached. The obtained chip having the adhesive layer attached thereto is attached to a semiconductor substrate. The chip is attached generally at 100 to 180° C. for 0.5 to 3 second with a pressure of 0.5 to 2 kgf/cm$^2$.

After the above processes are completed, a semiconductor device is obtained through wire bonding and molding processes.

The method for preparing a semiconductor device is not limited to the aforementioned processes, but may include any optional process or performed with the sequence of the processes changed. For example, the method may be performed in order of the tacky layer curing, dicing and expanding processes, or in order of the dicing, expanding, and tacky layer curing processes. After the chip attachment process, a heating or cooling process may be further included.

MODE FOR INVENTION

The present invention will be explained in more detail based on examples in order to specifically describe the present invention. However, the examples of the present invention may be changed in various ways, and the scope of the present invention is not limited to the following examples.

Example 1

A composition including 20 parts by weight of aromatic epoxy resin (novolac-type epoxy resin with a softening point of 80° C.), 10 parts by weight of phenol resin (phenol novolac resin with a softening point of 90° C.) as a curing agent of the epoxy resin, 70 parts by weight of epoxy group-containing acryl copolymer (SA-55, produced by LG Chem., Tg=5° C., average molecular weight of 500,000), 0.3 parts by weight of curing promoting agent (2-phenyl-4-methyl imidazole (2P4MZ)), and 10 parts by weight of silica (melt silica with an average diameter of 75 nm) as a filler was stirred and mixed in methylethylketone to prepare a varnish.

The adhesive resin composition was applied to a releasing film (SKC, RS-21G) having a thickness of 38 μm and then dried to make an adhesive film having a film thickness of 20 μm, which is commonly used in a packaging field. This adhesive film was laminated together with a dicing tape having a tacky power of 160 gf/inch at 180° C. against SUS 304 using a laminator (Fujisok Company) to obtain a dicing die bonding film for a semiconductor.

Example 2

A resin was prepared in the same manner as Example 1, except that 70 parts by weight of epoxy group-containing acryl copolymer (SA-05, produced by LG Chem., Tg=0° C., average molecular weight of 500,000) and 20 parts by weight of silica (melt silica with an average diameter of 75 nm) as a filler were used, and then an adhesive film was prepared.

Example 3

A resin was prepared in the same manner as Example 1, except that 70 parts by weight of epoxy group-containing acryl copolymer (SA-34, produced by LG Chem., Tg=20° C., average molecular weight of 300,000) and 5 parts by weight of silica (melt silica with an average diameter of 75 nm) as a filler were used, and then an adhesive film was prepared.

Example 4

A resin was prepared in the same manner as Example 1, except that 33 parts by weight of aromatic epoxy resin (novolac-type epoxy resin with a softening point of 80° C.), 17 parts by weight of phenol resin (phenol novolac resin with a softening point of 90° C.) as a curing agent of the epoxy resin, 50 parts by weight of epoxy group-containing acryl copolymer (SA-55, produced by LG Chem., Tg=5° C., average molecular weight of 500,000), and 5 parts by weight of silica (melt silica with an average diameter of 75 nm) as a filler were used, and then an adhesive film was prepared.

Comparative Example 1

A composition including 20 parts by weight of aromatic epoxy resin (novolac-type epoxy resin with a softening point of 80° C.), 10 parts by weight of phenol resin (phenol novolac resin with a softening point of 90° C.) as a curing agent of the epoxy resin, 70 parts by weight of epoxy group-containing acryl copolymer (SA-34, produced by LG Chem., Tg=20° C., average molecular weight of 300,000), 0.3 parts by weight of curing promoting agent (2-phenyl-4-methyl imidazole (2P4MZ)), and 20 parts by weight of silica (melt silica with an average diameter of 75 nm) as a filler was stirred and mixed in methylethylketone to make a varnish. A dicing die bonding film is prepared by using the varnish in the same manner as Example 1.

Comparative Example 2

A dicing die bonding film was prepared in the same manner as Example 1, except that a filler was not added.

Comparative Example 3

The adhesive film prepared in Example 1 was laminated together with a dicing tape having a tacky power of 400 gf/inch at 180° C. against SUS 304 using a laminator (Fujisok Company) to obtain a dicing die bonding film for a semiconductor.

Comparative Example 4

The adhesive film prepared in Example 1 was laminated together with a dicing tape having a tacky power of 50 gf/inch at 180° C. against SUS 304 using a laminator (Fujisok Company) to obtain a dicing die bonding film for a semiconductor.

<Property Evaluation>

For the dicing die bonding films of Examples 1 to 4 and Comparative Examples 1 to 4, the following properties were measured, and their evaluation results are shown in the following table 1.

1. Evaluation of Wafer Backside Adhension Property

The prepared adhesive film in A-stage state was laminated for 10 seconds to an 8-inch silicon wafer using a tape mounter (DS Precision Ind.) kept at 50° C. The backside adhension property was evaluated based on the presence or not of void after laminating.

2. Storage Elasticity at Normal Temperature

The adhesive film was cut in a certain direction into a size of 15(W) mm×45(L) mm for preparation. TA (Texture Analysis) was used to fix both ends of the sample by means of a jig such that a measurement portion of the sample is 25 mm in length, and then the storage elasticity was measured while the sample is expanded under the condition of 12.8 mm/min.

3. Interface Adhesive Power between Wafer and Die Bonding Adhesive Layer

The dicing die bonding film was cut into a size of 25(W) mm×150(L) mm for preparation. The prepared film was laminated using a 50° C. hot roll laminator such that the adhesive film comes in contact with a wafer. TA (Texture Analysis) was used to measure a 180° peeling power under the condition of 300 mm/min.

4. Interface Tacky Power between Die Bonding Adhesive Layer and Dicing Tape Tacky Layer The dicing die bonding film was cut into a size of 25(W) mm×150(L) mm for preparation. The adhesive layer of the die bonding portion of the prepared film was fixed to a glass plate, and then TA (Texture Analysis) was used to pull the dicing film and measure a 180° peeling power under the condition of 300 mm/min.

5. Observation Chip Scattering and Burr Generation

The dicing die bonding film was laminated to a wafer of 100 μm and a wafer ring using a mounter at 50° C. A dicing apparatus produced by NeonTech Co. was used to dice the wafer into chips each having a size of 2 mm×2 mm under the conditions of 4000 rpm and a feeding speed of 20 mm/sec, and then the occurrence or not of chip scattering and number % of singulated chips with burr generation were checked.

6. Picking-Up Success Rate

After the dicing process, the singulated chips to which the adhesive layer was attached were picked up from the dicing tape and then evaluated as good if no picking-up inferiority occurred and as bad if picking-up inferiority occurred.

7. Package Reliability

The chip adhered to a PCB substrate by means of the adhesive film, and then a temperature resistance cycle (wherein 1 cycle is defined as a process in which chip is left alone at −55° C. for 15 minutes and then left alone at 125° C. for 15 minutes) were conducted five times. Then, the chip was left alone for 72 hours in a constant temperature constant humidity chamber under the condition of 85° C./85%, and then, the sample passed through an IR reflow whose temperature was set such that a maximum temperature of the sample surface was kept for 20 seconds at 260° C. Then, the sample was left alone at a room temperature for cooling. This process was conducted three times, and cracks in the sample were observed by using an ultrasonic wave microscope. It was evaluated as good if no breakdown such as separation or crack occurred and as bad if breakdown occurred at one or more portions.

TABLE 1

|  | Examples | | | | Comparative Examples | | | |
| --- | --- | --- | --- | --- | --- | --- | --- | --- |
|  | 1 | 2 | 3 | 4 | 1 | 2 | 3 | 4 |
| Wafer-die bonding adhesive power X (gf) | 73 | 49 | 60 | 34 | 15 | 100 | 73 | 73 |
| Die bonding portion-dicing portion tacky power Y (gf) | 221 | 195 | 202 | 122 | 151 | 238 | 664 | 68 |
| X/Y* | 0.33 | 0.25 | 0.30 | 0.28 | 0.1 | 0.42 | 0.11 | 1.07 |

TABLE 1-continued

|  | Examples | | | | Comparative Examples | | | |
| --- | --- | --- | --- | --- | --- | --- | --- | --- |
|  | 1 | 2 | 3 | 4 | 1 | 2 | 3 | 4 |
| Normal temperature storage elasticity (MPa) | 125 | 276 | 150 | 235 | 1300 | 73 | 125 | 125 |
| Wafer backside adhension property | good | good | good | good | void | good | good | good |
| Chip scattering | no | no | no | no | scatter | no | no | scatter |
| Burr generation (%) | 1 | 0 | 1 | 0 | 80 | 0 | 30 | 10 |
| Picking-up inferiority | good | good | good | good | good | bad | bad | good |
| Package reliability | good | good | good | good | good | bad | good | good |

X/Y*: X = adhesive power between wafer and adhesive layer of die bonding portion, Y = tacky power between die bonding portion and tacky layer of dicing portion As shown in Table 1, it would be found that the dicing die bonding films of Examples 1 to 4 prepared according to the present invention are excellent in all of backside adhension property, chip scattering, burr generation, picking-up and package reliability, as compared with the dicing die bonding films of Comparative Examples 1 to 4. That is, it would be understood that burr generation during the singulation process is minimized to 2% or below, thereby improving connection reliability of the semiconductor package and minimizing an inferiority rate caused by the burr in a case where the ratio X/Y of the adhesive power X between the wafer and the adhesive layer of the die bonding portion to the tacky power Y between the die bonding portion and the tacky layer of the dicing portion is 0.25 to 1 and the adhesive layer of the die bonding portion has a normal temperature storage elasticity of 100 MPa to 1000 MPa.

Further, in a case where the ratio X/Y was low and the normal temperature storage elasticity was high, as Comparative Example 1, and particularly in a case where X was low, chip scattering occurred in the interface of the chip and the die bonding portion during a process of dicing chips into very small size, and burr occurred over a standard level. Also, in a case where the normal temperature storage elasticity was low and no inorganic filler was used, as Comparative Example 2, an elongate burr capable of covering the wire during a bonding process was not found, but picking-up inferiority occurred. Inferiority of package reliability at high temperature, such as curling up at an edge of the chip, was observed. In a case where the ratio X/Y was low since Y is large although X is large, as Comparative Example 3, burr generation over a standard level was observed, and also inferiority in picking-up occurred. In a case where the ratio X/Y is high as Comparative Example 4, chip scattering occurred at the interface between the adhesive layer and the dicing tape during a wafer singulation process, and burr occurred over a standard level.

The invention claimed is:

1. A dicing die bonding film, comprising:
a die bonding portion having an adhesive layer adapted to adhere to a wafer; and
a dicing portion having a tacky layer,
wherein a ratio X/Y of adhesive power X between the wafer and the adhesive layer of the die bonding portion to tacky power Y between the die bonding portion and the tacky layer of the dicing portion is 0.25 to 0.33, and the adhesive layer of the die bonding portion has a storage modulus of 125 to 276 MPa at a room temperature,
wherein the adhesive power X between the wafer and the adhesive layer of the die bonding portion is 30 to 75 gf/inch, and the tacky power Y between the die bonding portion and the tacky layer of the dicing portion is 122 to 221 gf/inch,
wherein the adhesive layer of the die bonding portion consists of a) a thermosetting multi-functional epoxy resin, b) an acryl copolymer containing glycidyl groups, c) a curing agent, d) a curing promoting agent, and e) an inorganic filler,
wherein the a) thermosetting multi-functional epoxy resin contains at least two epoxy groups in a main chain and has a glass transition temperature of 50° C. or above, and
wherein the b) acryl copolymer containing glycidyl groups has a glass transition temperature of 50° C. or below.

2. The dicing die bonding film as claimed in claim 1, wherein the a) thermosetting multi-functional epoxy resin has an average epoxy equivalent weight of 180 to 1000.

3. The dicing die bonding film as claimed in claim 1, wherein the a) thermosetting multi-functional epoxy resin is at least one selected from the group consisting of cresol novolac epoxy resin, bisphenol A novolac epoxy resin, phenol novolac epoxy resin, 4-functional epoxy resin, biphenyl epoxy resin, tri-phenol methane epoxy resin, alkyl-modified tri-phenol methane epoxy resin, naphthalene epoxy resin, dicyclopentadiene epoxy resin, and dicyclopentadiene-modified phenol epoxy resin.

4. The dicing die bonding film as claimed in claim 1, wherein the curing agent is a multi-functional phenol resin.

5. The dicing die bonding film as claimed in claim 4, wherein the multi-functional phenol resin has a hydroxyl equivalent weight of 100 to 1000.

6. The dicing die bonding film as claimed in claim 4, wherein the multi-functional phenol resin is at least one selected from the group consisting of bisphenol A resin, phenol novolac resin, cresol novolac resin, bisphenol A novolac resin, phenol aralkyl resin, multi-functional novolac, dicyclopentadiene phenol novolac resin, amino triazine phenol novolac resin, polybutadiene phenol novolac resin, and biphenyl resin.

7. The dicing die bonding film as claimed in claim 1, wherein the curing agent has an equivalent weight 0.4 to 2 times as large as the equivalent weight of the a) thermosetting multi-functional epoxy resin.

8. The dicing die bonding film as claimed in claim 1, wherein the die bonding portion further includes a protective film.

9. The dicing die bonding film as claimed in claim 1, wherein the tacky layer of the dicing portion includes an acryl-based copolymer.

10. A semiconductor wafer, wherein the adhesive layer of the dicing die bonding film according to claim 1 is attached to one side of the wafer, and the tacky layer of the dicing die bonding film is fixed to a wafer ring frame.

11. A semiconductor device, comprising:
  a wiring substrate;
  an adhesive layer of the dicing die bonding film according to claim 1 attached to a chip mounting surface of the wiring substrate; and
  a semiconductor chip mounted on the adhesive layer.

* * * * *